United States Patent
Foye

(10) Patent No.: US 6,422,024 B1
(45) Date of Patent: Jul. 23, 2002

(54) INSULATED BEVERAGE COOLING CONTAINER

(76) Inventor: Matthew R. Foye, 59 Cedar St., Plympton, MA (US) 02367

( * ) Notice: Subject to any disclaimer, the term of this patent is extended or adjusted under 35 U.S.C. 154(b) by 0 days.

(21) Appl. No.: 09/641,858

(22) Filed: Aug. 18, 2000

(51) Int. Cl.$^7$ ................................................ F25B 21/02
(52) U.S. Cl. ............................. 62/3.2; 62/3.3; 62/457.9
(58) Field of Search ................................. 62/3.3, 457.9, 62/3.2

(56) References Cited

U.S. PATENT DOCUMENTS

| | | | | |
|---|---|---|---|---|
| 4,274,262 A | * | 6/1981 | Reed et al. ................... | 62/3 |
| 4,880,535 A | * | 11/1989 | Burrows ...................... | 210/181 |
| 5,042,258 A | * | 8/1991 | Sundhar ....................... | 62/3.2 |
| 5,842,353 A | * | 12/1998 | Kuo-Liang ................... | 62/190 |
| 5,927,085 A | * | 7/1999 | Waldman ..................... | 62/129 |
| 6,119,461 A | * | 9/2000 | Stevick et al. ................ | 62/3.64 |
| 6,141,969 A | * | 11/2000 | Launchbury et al. ......... | 62/3.2 |

* cited by examiner

Primary Examiner—William C. Doerrler
Assistant Examiner—Mark S. Shulman

(57) ABSTRACT

An insulated beverage cooling container for cooling and insulating a beverage. The insulated beverage cooling container includes a container having a base wall. A peripheral side wall is integrally coupled to a periphery of the base wall and extends upwardly therefrom for defining an interior space and an upper peripheral edge. The container further includes a generally horizontally orientated first intermediate face mounted to the peripheral side wall above and in general parallel orientation with the base wall for defining a first compartment. A perimeter wall is integrally coupled to and extends downwardly away from the periphery of the base wall for defining a space and a lower peripheral edge. A second intermediate face is mounted to the perimeter wall below and in general parallel orientation with the base wall for defining a second compartment and a lower peripheral edge. The second intermediate face has a plurality of holes therethrough. A cooling means absorbs heat for cooling the contents of the housing. The cooling means includes a first heat sink positioned in the first compartment, a second heat sink positioned in the second compartment, and a thermoelectric device positioned in the base wall.

15 Claims, 3 Drawing Sheets

INSULATED BEVERAGE COOLING CONTAINER

BACKGROUND OF THE INVENTION

1. Field of the Invention

The present invention relates to insulated beverage containers and more particularly pertains to a new insulated beverage cooling container for cooling and insulating a beverage.

2. Description of the Prior Art

The use of insulated beverage containers is known in the prior art. More specifically, insulated beverage containers heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. No. 4,052,590; U.S. Pat. No. 4,801,782; U.S. Pat. No. 5,243,684; U.S. Pat. No. Des. 243,498; U.S. Pat. No. Des. 333,756; U.S. Pat. No. 3,813,517; U.S. Pat. No. 5,042,258; and U.S. Pat. No. 6,000,224.

While these devices fulfill their respective, particular objectives and requirements, the aforementioned patents do not disclose a new insulated beverage cooling container. The inventive device includes a container having a base wall. A peripheral side wall is integrally coupled to a periphery of the base wall and extends upwardly therefrom for defining an interior space and an upper peripheral edge. The container further includes a generally horizontally orientated first intermediate face mounted to the peripheral side wall above and in general parallel orientation with the base wall for defining a first compartment. A perimeter wall is integrally coupled to and extends downwardly away from the periphery of the base wall for defining a space and a lower peripheral edge. A second intermediate face is mounted to the perimeter wall below and in general parallel orientation with the base wall for defining a second compartment and a lower peripheral edge. The second intermediate face has a plurality of holes therethrough. A cooling means absorbs heat for cooling the contents of the housing. The cooling means includes a first heat sink positioned in the first compartment, a second heat sink positioned in the second compartment, and a thermo-electric device positioned in the base wall.

In these respects, the insulated beverage cooling container according to the present invention substantially departs from the conventional concepts and designs of the prior art, and in so doing provides an apparatus primarily developed for the purpose of cooling and insulating a beverage.

SUMMARY OF THE INVENTION

In view of the foregoing disadvantages inherent in the known types of insulated beverage containers now present in the prior art, the present invention provides a new insulated beverage cooling container construction wherein the same can be utilized for cooling and insulating a beverage.

The general purpose of the present invention, which will be described subsequently in greater detail, is to provide a new insulated beverage cooling container apparatus and method which has many of the advantages of the insulated beverage containers mentioned heretofore and many novel features that result in a new insulated beverage cooling container which is not anticipated, rendered obvious, suggested, or even implied by any of the prior art insulated beverage containers, either alone or in any combination thereof.

To attain this, the present invention generally comprises a container having a base wall. A peripheral side wall is integrally coupled to a periphery of the base wall and extends upwardly therefrom for defining an interior space and an upper peripheral edge. The container further includes a generally horizontally orientated first intermediate face mounted to the peripheral side wall above and in general parallel orientation with the base wall for defining a first compartment. A perimeter wall is integrally coupled to and extends downwardly away from the periphery of the base wall for defining a space and a lower peripheral edge. A second intermediate face is mounted to the perimeter wall below and in general parallel orientation with the base wall for defining a second compartment and a lower peripheral edge. The second intermediate face has a plurality of holes therethrough. A cooling means absorbs heat for cooling the contents of the housing. The cooling means includes a first heat sink positioned in the first compartment, a second heat sink positioned in the second compartment, and a thermo-electric device positioned in the base wall.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new insulated beverage cooling container apparatus and method which has many of the advantages of the insulated beverage containers mentioned heretofore and many novel features that result in a new insulated beverage cooling container which is not anticipated, rendered obvious, suggested, or even implied by any of the prior art insulated beverage containers, either alone or in any combination thereof.

It is another object of the present invention to provide a new insulated beverage cooling container which may be easily and efficiently manufactured and marketed.

It is a further object of the present invention to provide a new insulated beverage cooling container which is of a durable and reliable construction.

An even further object of the present invention is to provide a new insulated beverage cooling container which is susceptible of a low cost of manufacture with regard to both materials and labor, and which accordingly is then susceptible of low prices of sale to the consuming public, thereby making such insulated beverage cooling container economically available to the buying public.

Still yet another object of the present invention is to provide a new insulated beverage cooling container which provides in the apparatuses and methods of the prior art some of the advantages thereof, while simultaneously overcoming some of the disadvantages normally associated therewith.

Still another object of the present invention is to provide a new insulated beverage cooling container for cooling and insulating a beverage.

Yet another object of the present invention is to provide a new insulated beverage cooling container which includes a container having a base wall. A peripheral side wall is integrally coupled to a periphery of the base wall and extends upwardly therefrom for defining an interior space and an upper peripheral edge. The container further includes a generally horizontally orientated first intermediate face mounted to the peripheral side wall above and in general parallel orientation with the base wall for defining a first compartment. A perimeter wall is integrally coupled to and extends downwardly away from the periphery of the base wall for defining a space and a lower peripheral edge. A second intermediate face is mounted to the perimeter wall below and in general parallel orientation with the base wall for defining a second compartment and a lower peripheral edge. The second intermediate face has a plurality of holes therethrough. A cooling means absorbs heat for cooling the contents of the housing. The cooling means includes a first heat sink positioned in the first compartment, a second heat sink positioned in the second compartment, and a thermoelectric device positioned in the base wall.

Still yet another object of the present invention is to provide a new insulated beverage cooling container that uses a thermoelectric device to cool a beverage contained in the container.

Even still another object of the present invention is to provide a new insulated beverage cooling container that may be used to heat a beverage by reversing the current flow.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
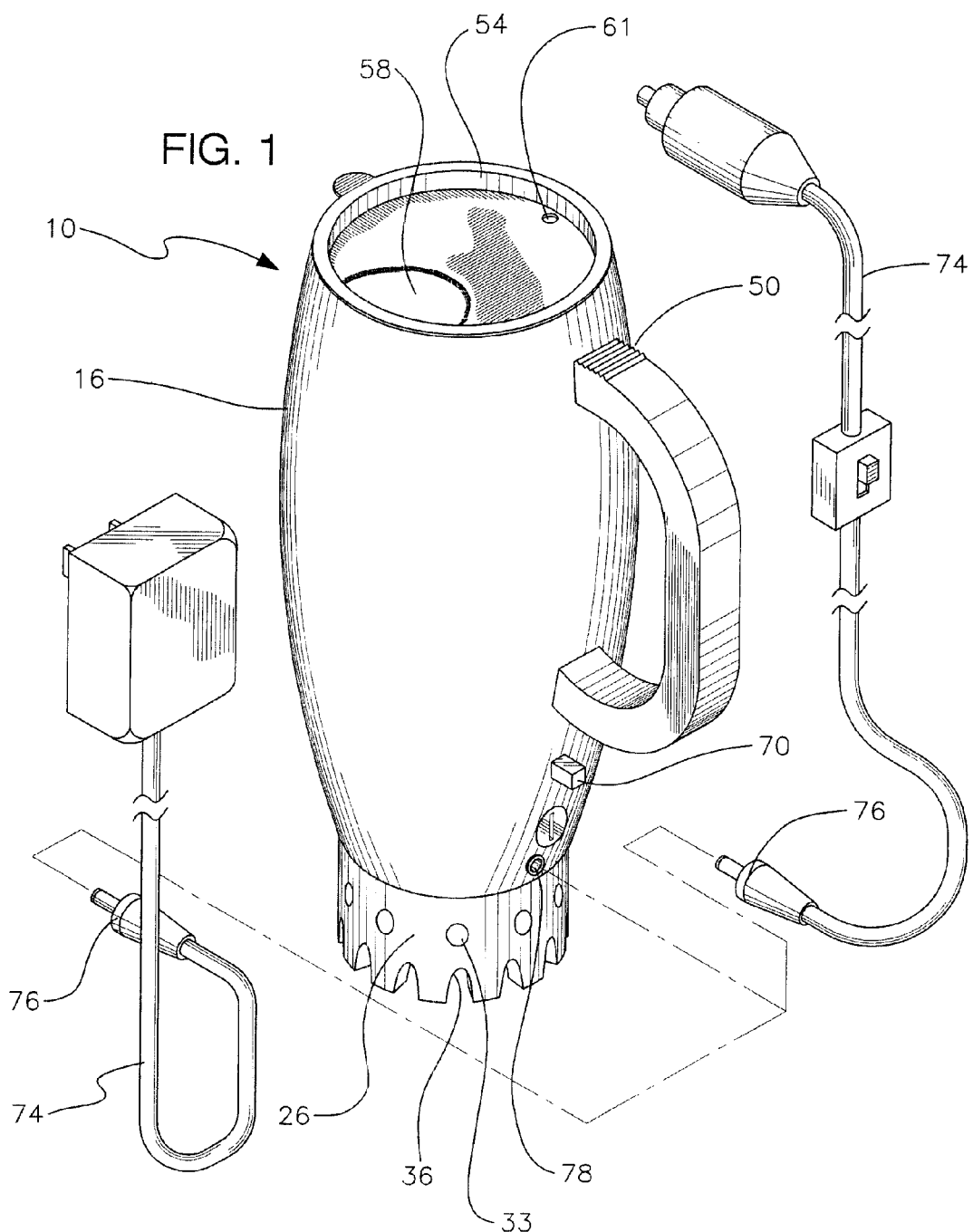
FIG. 1 is a schematic perspective view of a new insulated beverage cooling container according to the present invention.
Figure 2:
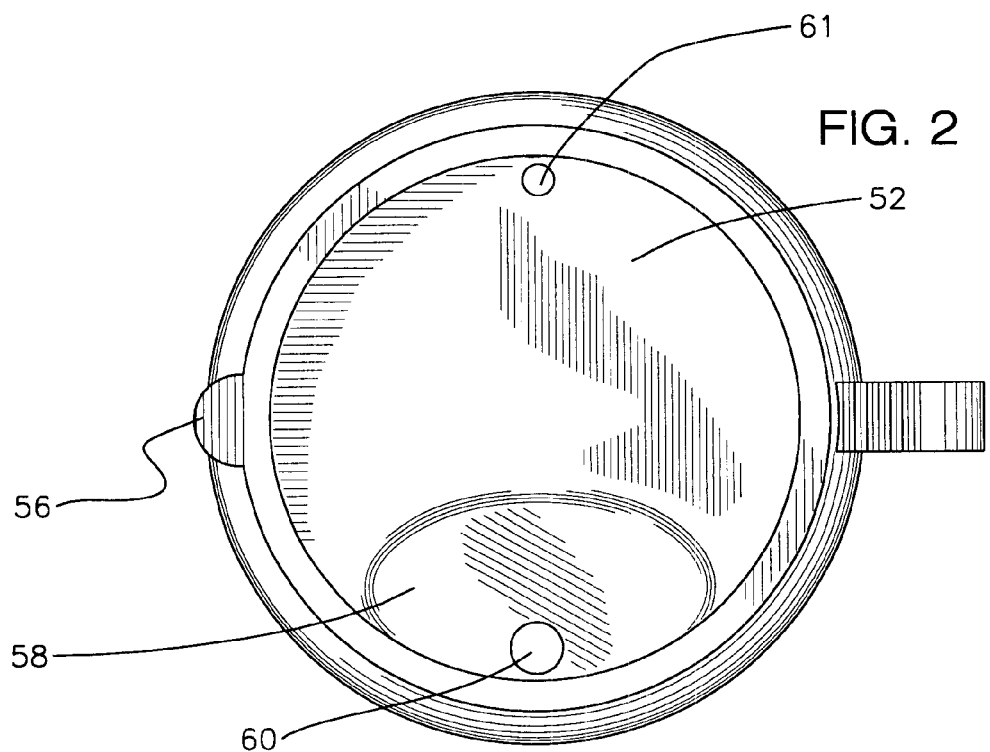
FIG. 2 is a schematic top view of the present invention.
Figure 3:
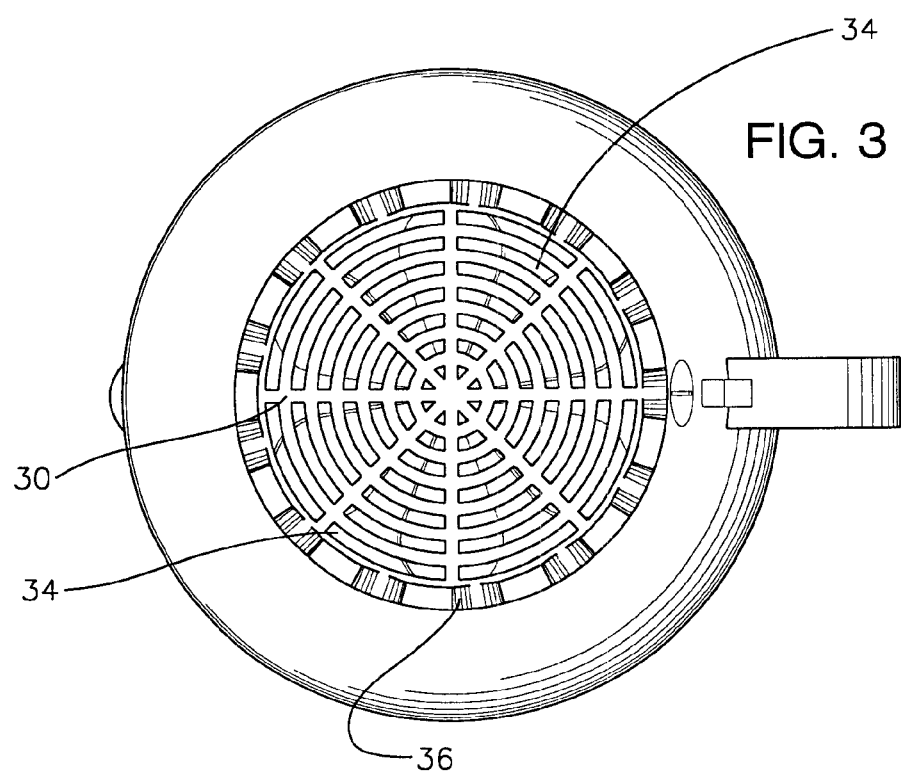
FIG. 3 is a schematic bottom view of the present invention.
Figure 4:
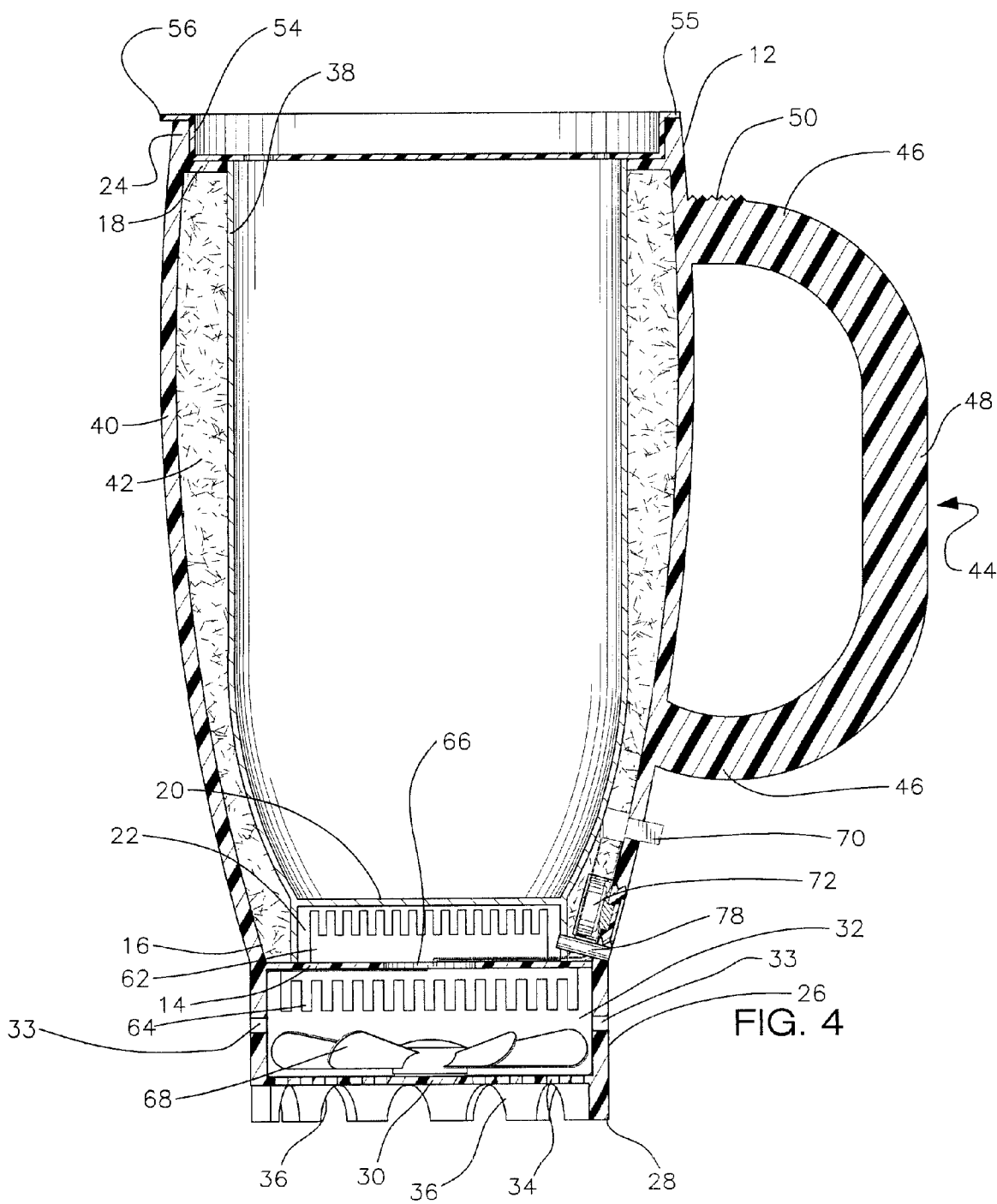
FIG. 4 is a schematic side cross-sectional view of the present invention.

With reference now to the drawings, and in particular to FIGS. 1 through 4 thereof, a new insulated beverage cooling container embodying the principles and concepts of the present invention and generally designated by the reference numeral 10 will be described.

As best illustrated in FIGS. 1 through 4, the insulated beverage cooling container 10 generally comprises a container 12. The container 12 has a base wall 14. A peripheral side wall 16 is integrally coupled to a periphery of the base wall 14 and extends upwardly therefrom for defining an interior space and an upper peripheral edge 18. The container 12 further includes a generally horizontally orientated first intermediate face 20 mounted to the peripheral side wall 16 above and in general parallel orientation with the base wall 14 for defining a first compartment 22. An annular lip 24 extends upwardly from and is integral to the upper peripheral edge 18. A perimeter wall 26 is integrally coupled to and extends downwardly away from the periphery of the base wall 14 for defining a space and a lower peripheral edge 28. A second intermediate face 30 is mounted to the perimeter wall 26 below and is generally in a parallel orientation with the base wall 12 for defining a second compartment 32. A plurality of openings 33 extend through the perimeter wall 26 and are positioned between the base wall 14 and the intermediate face 30 to facilitate airflow into the second compartment 32. The second intermediate face 30 has a plurality of holes 34 therethrough. The lower peripheral edge 28 has a plurality of arcuate detents 36 therein. The peripheral side wall 16 comprises an interior wall 38 in a spaced relationship with an exterior wall 40. The interior wall 38 comprises a conductive material which is preferably a metal and ideally stainless steel. The exterior wall 40 may be of any material but preferably comprises a non-conductive material, which is ideally a plastic material. The space between the interior and exterior walls comprises an insulating material 42.

A handle 44 includes a pair of horizontally orientated arms 46 that are integrally coupled to the peripheral side wall and extend radially therefrom. A vertical extent 48 is coupled between outboard ends of the arms 46. A top edge of an upper one of the arms has a plurality of gripping ridges 50 thereon.

A cap 52 comprises a plate having a generally circular configuration with an upwardly extending annular flange 54 for abutting against and releasably engaging an interior surface of the annular lip 24. The flange may have a ridge 55 for abutting against a top edge of the annular lip 24. The annular flange 54 has a tab 56 coupled thereto and extending radially therefrom for facilitating the removal of the cap 52 from the container. A top surface of the plate has a depression 58 therein positioned generally adjacent to a periphery of the plate. A drinking aperture 60 is positioned in the depression 58. A breathing aperture 61 is positioned adjacent to the periphery of the cap 52 on a diametrically opposed portion of the cap 52 with respect to the drinking aperture 60.

A cooling means absorbs heat for cooling the contents of the housing. The cooling means includes a first heat sink 62 securely mounted to the base wall 14 and positioned in the first compartment 22. The first heat sink 62 is positioned generally adjacent to the first intermediate face 20. A second heat sink 64 is securely mounted to the base wall 14 and is positioned in the second compartment 32. A thermoelectric device 66 is positioned in the base wall 14. The thermoelectric device 66 is ideally abutted against the first 62 and second 64 heat sinks. Ideally, there is no air circulation between the first and second heat sinks. A wall or insulation may accomplish this. The present embodiment employs the base wall 14 to being positioned between the heat sinks.

The thermo-electric device 66 uses flow of current to facilitate heat transfer. To accomplish this, semiconductors may be used to exploit the "peltier effect". In such embodiment, a reversal of current flow through a specially configured N-type and P-type semiconductor, or a dissimilar wire harness, is employed. One of the semiconductors draws heat while the other expels heat. By positioning the semiconductor drawing heat against the first heat sink 62, heat is pulled from the container 12 and transferred to the second heat sink 64. The current may be reversed in which case the device would heat the contents of the container instead of cooling them.

A fan means 68 disperses air across the second heat sink 64 and is mounted on the second intermediate face 30. The fan means 68 is a conventional fan and will cool the second heat sink 64 in order to draw more heat from the first heat sink 62 via the thermo-electric device 66. Heat thus flows from the container 12, through the heat sinks 62, 64 and out of the apertures 34 in the second intermediate face 30. In a heating mode, the fan means 68 would not be utilized.

An actuating means 70 selectively turns the fan means 68 and the thermo-electric device 66 on and off. The actuating means 70 is preferably mounted on the peripheral side wall 16. The actuating means 70 is operationally coupled to the fan means 68 and the thermo-electric device 66.

A power supply powers the fan means 68 and the thermoelectric device 66. The power supply is operationally coupled to the actuating means 70. The power supply may be a battery 72 removably mounted in the peripheral side wall or may be a plug 74 for plugging into a vehicle cigarette lighter port or a conventional wall-type socket. The plug 74 having an end having a jack 76 thereon for inserting into a bore 78 in the peripheral side wall 16 for operationally coupling to the actuating means 70.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A beverage cooling device comprising, in combination:
   a container comprising:
      a container base for resting on a surface; and
      a peripheral side wall extending upwardly from a periphery of said container base such that said container base and said peripheral side wall define an interior space of the container for receiving liquids:
      wherein said container base comprises:
         a base wall;
         a side wall extending upwardly from said base wall;
         a first intermediate wall located above said base wall, said first intermediate wall being mounted to said side wall, said base wall and said first intermediate wall defining a first compartment therebetween, said first compartment having an interior;
         a perimeter wall extending downwardly from said base wall, said perimeter wall having a lower peripheral edge;
         a second intermediate wall located below said base wall, said second intermediate wall being mounted to said perimeter wall, said base wall and said second intermediate wall defining a second compartment therebetween, said second compartment having an interior, said second intermediate wall having a plurality of holes therethrough;
      wherein said perimeter wall has a plurality of openings extending therethrough, said openings being positioned between said base wall and said second intermediate face and being in fluid communication with the interior of said second compartment for permitting air flow out of the interior of said second compartment; and
   heat transfer means for transferring heat into or out of liquid held in said interior space of said container, said cooling means being located in said container base, said heat transfer means comprising:
      a first heat sink mounted on said base wall and being positioned in said first compartment, said first heat sink extending toward said first intermediate wall;
      a second heat sink mounted on said base wall and being positioned in said second compartment, said second heat sink extending toward said second intermediate wall; and
      a thermo-electric device for selectively moving heat between said first and second heat sinks, said thermo-electric device being positioned on said base wall, said thermo-electric device being positioned between and abutting against said first and second heat sinks such that said thermo-electric device selectively transfers heat to one of said first and second sinks and transfers heat from the other of said first and second sinks.

2. The device of claim 1 additionally comprising a fan for moving air toward and across said second heat sink, said fan being mounted on said second intermediate wall in said second compartment for pulling air through the plurality of holes in said second intermediate wall and into said second compartment for moving across said second heat sink.

3. The device of claim 2 additionally comprising an actuating means for selectively supplying power to said fan and said thermo-electric device, said actuating means being electrically coupled to said fan and said thermo-electric device, said actuating means comprising a switch.

4. The device of claim 3 additionally comprising a power supply for powering said fan and said thermo-electric device, said power supply being electrically coupled to said actuating means.

5. The device of claim 1 wherein said side wall extends substantially perpendicularly to said base wall, and said side wall being generally annular in shape.

6. The device of claim 1 wherein said first intermediate wall is oriented in a substantially parallel orientation with respect to said base wall.

7. The device of claim 1 wherein said second intermediate wall is oriented in a substantially parallel orientation with respect to said base wall.

8. The device of claim 1 wherein said second intermediate wall is spaced from the lower peripheral edge of said perimeter wall.

9. The device of claim 1 wherein said lower peripheral edge of said perimeter wall has a plurality of apertures therein for permitting air flow through said perimeter wall and through the plurality of holes of said second intermediate wall and into the interior of said second compartment.

10. The device of claim 1 wherein said peripheral side wall comprises:
   an interior wall forming an interior surface of said container for contacting liquid placed in the interior space of said container, said interior wall being integrally mounted on said first intermediate wall such that said first intermediate wall forms a lower surface of said interior space of said container;
   an exterior wall extending about and in a spaced relationship with said interior wall; and
   an insulating material positioned between said interior and exterior walls for resisting heat transfer between said interior and exterior walls.

11. The device of claim 10 wherein, said interior wall comprising a heat conductive material, and said exterior wall comprising a heat transfer resisting material.

12. The device of claim 1 additionally comprising a handle including a pair of arms extending radially outward from said peripheral side wall and a gripping extent extending between said pair of arms at outboard ends of said arms, a top surface of an upper one of said arms having a plurality of gripping ridges formed thereon.

13. The device of claim 1 wherein said peripheral side wall has an upper peripheral edge and an annular lip extending upwardly from said upper peripheral edge.

14. The device of claim 13 additionally comprising a cap including:
   a plate having a circular configuration, a top surface of said plate having a depression therein positioned generally adjacent to a periphery of said plate, a drinking aperture being positioned in said depression, a venting aperture being positioned adjacent to the periphery of said cap on a diametrically opposed position on said cap with respect to said drinking aperture; and
   an annular flange upwardly extending from said plate for abutting against and releasably engaging an interior surface of said annular lip of said peripheral side wall, said annular flange having a tab coupled thereto and extending radially outward therefrom for facilitating the removal of said cap from said container.

15. A beverage cooling device comprising, in combination:
   a container comprising:
      a container base for resting on a surface, said container base including:
         a base wall;
         a side wall extending upwardly from said base wall, said side wall being generally annular in shape, said side wall extending substantially perpendicularly to said base wall;
         a first intermediate wall located above said base wall, said first intermediate wall being mounted to said side wall, said first intermediate wall being oriented in a substantially parallel orientation with respect to said base wall, said base wall and said first intermediate wall defining a first compartment therebetween, said first compartment having an interior;
         a perimeter wall extending downwardly from said base wall, said perimeter wall having a lower peripheral edge;
         a second intermediate wall located below said base wall, said second intermediate wall being mounted to said perimeter wall, said second intermediate wall being oriented in a substantially parallel orientation with respect to said base wall, said base wall and said second intermediate wall defining a second compartment therebetween, said second compartment having an interior, said second intermediate wall having a plurality of holes therethrough, said second intermediate wall being spaced from the lower peripheral edge of said perimeter wall;
         wherein said lower peripheral edge of said perimeter wall has a plurality of apertures therein for permitting air flow through said perimeter wall and through the plurality of holes of said second intermediate wall and into the interior of said second compartment;
         wherein said perimeter wall has a plurality of openings extending therethrough, said openings being positioned between said base wall and said second intermediate face and being in fluid communication with the interior of said second compartment for permitting air flow out of the interior of said second compartment;
      a peripheral side wall extending upwardly from a periphery of said container base such that said container base and said peripheral side wall define an interior space of the container for receiving liquids, said peripheral side wall having an upper peripheral edge, an annular lip extending upwardly from said upper peripheral edge of said peripheral side wall, said peripheral side wall comprising:
         an interior wall forming an interior surface of said container for contacting liquid placed in the interior space of said container, said interior wall being integrally mounted on said first intermediate wall such that said first intermediate wall forms a lower surface of said interior space of said container, said interior wall comprising a heat conductive material, said interior wall comprising a metal;
         an exterior wall extending about and in a spaced relationship with said interior wall, said exterior wall comprising a heat transfer resisting material, said exterior wall comprising a plastic material; and
         an insulating material positioned between said interior and exterior walls for resisting heat transfer between said interior and exterior walls;
      a handle comprising a pair of arms extending radially outward from said peripheral side wall and a gripping extent extending between said pair of arms at outboard ends of said arms, a top surface of an upper one of said arms having a plurality of gripping ridges formed thereon;
      a cap comprising:
         a plate having a circular configuration, a top surface of said plate having a depression therein positioned generally adjacent to a periphery of said plate, a drinking aperture being positioned in said depression, a venting aperture being positioned adjacent to the periphery of said cap on a diametrically opposed position on said cap with respect to said drinking aperture;

an annular flange upwardly extending from said plate for abutting against and releasably engaging an interior surface of said annular lip of said peripheral side wall, said annular flange having a tab coupled thereto and extending radially outward therefrom for facilitating the removal of said cap from said container;

heat transfer means for transferring heat in to or out of liquid held in said interior space of said container, said cooling means being located in said container base, said heat transfer means comprising:

a first heat sink mounted on said base wall and being positioned in said first compartment, said first heat sink extending toward said first intermediate wall;

a second heat sink mounted on said base wall and being positioned in said second compartment, said second heat sink extending toward said second intermediate wall;

a thermo-electric device for selectively moving heat between said first and second heat sinks, said thermo-electric device being positioned in said base wall, said thermo-electric device being positioned between and abutting against said first and second heat sinks such that said thermo-electric device selectively transfers heat to one of said first and second sinks and transfers heat from the other of said first and second sinks;

a fan for moving air toward and across said second heat sink, said fan being mounted on said second intermediate wall for pulling air through the plurality of holes in said second intermediate wall and into said second compartment for moving across said second heat sink;

an actuating means for selectively supplying power to said fan and said thermo-electric device, said actuating means being mounted on said peripheral side wall, said actuating means being electrically coupled to said fan and said thermo-electric device, said actuating means comprising a switch; and a power supply for powering said fan and said thermo-electric device, said power supply being electrically coupled to said actuating means.

* * * * *